United States Patent [19]

Raver

[11] Patent Number: 4,567,378
[45] Date of Patent: Jan. 28, 1986

[54] DRIVER CIRCUIT FOR CONTROLLING SIGNAL RISE AND FALL IN FIELD EFFECT TRANSISTOR PROCESSORS

[75] Inventor: Norman Raver, Yorktown Heights, N.Y.

[73] Assignee: International Business Machines Corporation, Armonk, N.Y.

[21] Appl. No.: 620,235

[22] Filed: Jun. 13, 1984

[51] Int. Cl.$^4$ .................... H03K 3/01; H03K 17/687
[52] U.S. Cl. .................................. 307/270; 307/571; 307/263
[58] Field of Search ................ 307/254, 270, 571–583, 307/263–268

[56] References Cited

U.S. PATENT DOCUMENTS

| | | | |
|---|---|---|---|
| 3,436,563 | 4/1969 | Regitz | 307/270 |
| 3,535,555 | 10/1970 | Heimer | 307/251 |
| 3,868,519 | 2/1975 | Green | 307/270 |
| 3,906,254 | 9/1975 | Lane et al. | 307/205 |
| 3,909,633 | 9/1975 | Hall, II | 307/268 |
| 3,914,623 | 10/1975 | Clancy | 307/229 |
| 3,973,145 | 8/1976 | Schmitt et al. | 307/263 |
| 4,029,972 | 6/1977 | Fox et al. | 307/228 |
| 4,132,906 | 1/1979 | Allen | 307/254 |
| 4,216,393 | 8/1980 | Gillberg et al. | 307/270 |
| 4,250,410 | 2/1981 | Moench et al. | 307/263 |
| 4,314,166 | 2/1982 | Bismarck | 307/475 |
| 4,322,785 | 3/1982 | Walker | 307/270 |
| 4,329,600 | 5/1982 | Stewart | 307/571 |
| 4,359,650 | 11/1982 | Newcomb | 307/270 |
| 4,527,081 | 7/1985 | Stewart | 307/571 |

OTHER PUBLICATIONS

IBM Technical Disclosure Bulletin, vol. 25, No. 3A, Aug. 1982 at p. 997 by G. J. Gaudenzi et al., Title: Low $\Delta I/\Delta t$ Push-Pull Driver.

IBM Technical Disclosure Bulletin, vol. 25, No. 3A, Aug. 1982, at p. 999 by G. J. Gaudenzi et al., Title: Push-Pull Driver with $\Delta I/\Delta t$ and $\Delta v/\Delta t$ Control.

IBM Technical Disclosure Bulletin, vol. 25, No. 3A, Aug. 1982 at p. 1264 by L. Parks et al., Title: Early Detection of Simultaneous Current Switching on Integrated Circuit Chips.

Primary Examiner—Larry N. Anagnos
Assistant Examiner—B. P. Davis
Attorney, Agent, or Firm—John J. Goodwin

[57] ABSTRACT

An off-chip driver (OCD) circuit is described including a first output device and a second output device having a common output connection wherein a rising (1 bit) or falling (0 bit) signal is applied through an input circuit 24 to the output devices. The output signal which appears at the common output connection will exhibit a rise time and a fall time corresponding to the rise and fall of the input signal. A first monitoring device is connected to the output signal to monitor the rise time of the output signal and a second monitoring device is connected to the output signal to monitor the fall time of the output signal. A ramp generator is provided which generates a reference signal which also includes a rise time and a fall time. The two monitor circuits and compare the rise and fall times of the output signal with the reference rise time and reference fall time to produce a feedback signal to control the rise and fall times of the output signal in accordance with the reference signal.

4 Claims, 4 Drawing Figures

| FIG. 2A | FIG. 2B |

DRIVER CIRCUIT FOR CONTROLLING SIGNAL RISE AND FALL IN FIELD EFFECT TRANSISTOR PROCESSORS

BACKGROUND OF THE INVENTION

1. Field of the Invention

The present invention relates to Field Effect Transistor (FET) microprocessors, and more particularly to a line driver circuit for reducing off-chip electrical disturbances in an FET processor by controlling the rise time and fall time of input signals.

2. Description of the Prior Art

Circuits are available in the prior art which attempt to control signal rise time. In U.S. Pat. No. 4,132,906 issued Jan. 2, 1979 to Allen, entitled CIRCUIT TO IMPROVE RISE TIME AND/OR REDUCE PARASITIC POWER SUPPLY SPIKE CURRENT IN BIPOLAR TRANSISTOR LOGIC CIRCUITS, an improvement in output rise time and a reduction in the parasitic power supply strike current is achieved in bipolar transistor logic circuits using an AC coupled feedback circuit. During the low to high transition of the output, an internal voltage is AC coupled to an amplifier which in turn provides a low impedance path at the base of a lower output drive transistor which is coming out of conduction.

In this patent, a dual (upper and lower) transistor push-pull output drive stage for a bipolar transistor logic circuit is described. Under low capacitance load conditions, a fast transient voltage occurs on the collector of the lower transistor. Thus a large amount of current is coupled into the base of the transistor while it is coming out of conduction. This current into the base of the lower output transistor will tend to turn the transistor back on so that for a period of time both the upper and lower output driver transistors are carrying current directly from the power supply through the two transistors to ground. As a result there may be current spikes drawn from the power supply which in turn waste power and introduce noise into the rest of the system.

Thus, to avoid the spike between the output transistors during turn-on, an uncontrolled feedback signal is coupled to the in-phase signal to turn off the lower transistor. This circuit only speeds up the turn-off time of the device, and actually increases the di/dt of the turn-off device.

In U.S. Pat. No. 3,436,563 issued Apr. 1, 1969 to Regitz entitled PULSE DRIVER WITH LINEAR CURRENT RISE, a pulse driver circuit is described wherein the emitter circuit of the output transistor includes a resistor and inductor in series. Two feedback transistors provide variable shunts of the input drive pulses. One, driven by the voltage across the inductor, limits the rate of increase of output current to a constant value. The second, driven by the voltage across the inductor and resistor, limits the output pulse amplitude to a constant value.

In this circuit, the obtaining of a feedback signal from an inductance requires an undesirably high voltage and results in a linear ramp (di/dt) of current which is not suitable for off-chip drivers. This circuit also only deals with turn-on, not turn-off.

In U.S. Pat. No. 3,914,623 issued Oct. 21, 1975 to Clancy entitled WAVEFORM GENERATOR INCLUDING MEANS FOR AUTOMATIC SLOPE CALIBRATION, a waveform generator such as a sawtooth wave generator is described wherein automatic slope calibration is provided. A variable resistance element is feedback-responsive and provides an input voltage which affects waveform shape. The shape of the waveform is controlled automatically by a time error signal through the use of a feedback loop which controls the input voltage.

The following patents are cited because they are related to the general area of signal slope control:

| | |
|---|---|
| U.S. Pat. No. 4,029,972 | Fox et al |
| U.S. Pat. No. 3,973,145 | Schmitt et al |
| U.S. Pat. No. 3,535,555 | Heimer |
| U.S. Pat. No. 3,868,519 | Green |
| U.S. Pat. No. 3,909,633 | Hall |
| U.S. Pat. No. 4,250,410 | Moench et al |
| U.S. Pat. No. 3,906,254 | Lane et al |
| U.S. Pat. No. 4,216,393 | Gillberg et al |
| U.S. Pat. No. 4,314,166 | Bismarck |

IBM Technical Disclosure Bulletin Vol. 25, No. 3A August 1982 at page 997 by Gaudenzi et al IBM Technical Disclosure Bulletin Vol. 25, No. 3A August 1982 at page 999 by Gaudenzi et al IBM Technical Disclosure Bulletin Vol. 25, No. 3A August 1982 at page 1264 by Parks et al.

SUMMARY OF THE INVENTION

FET microprocessor technology is continually improving in both speed and packing density, leading to more circuits per chip and reduced cycle time. This combination gives rise to electrical disturbance problems because of the imperfections of the electrical package. To overcome these difficulties, chip-to-chip signalling through the package is usually done with specially designed off-chip-drivers (OCD) and off-chip-receivers (OCR). The present invention provides a new type of improved OCD to deal with these problems.

Electrical disturbances occurring off-chip, and caused by the electrical package, could cause sufficient noise so that some latch on a chip will be inadvertently switched, causing an intermittent failure of the circuitry.

Disturbances considered in the present invention include those due to Mdi/dt Ldi/dt and reflections from the transmission line.

Normally, an OCD is designed to operate over a wide range of output loads. The output signal traverses a worst case path which has a total capacitance that must be charged and discharged to some level in an acceptable time. The size of the two usual output devices are determined from this criteria. The internal delay of the OCD adds to this external interval, giving an overall delay for worst case (large) load. Parameter variations due to the manufacturing process are included. For output loads which are smaller, the excess drive capacity of the two output devices cause faster outputs. Ideally, top current and bottom current never occur at the same instant. The peak value of output current as well as the di/dt of this current are kept as small as possible. Properly designed, the capacitive load and overall delay are traded off for peak current and large di/dt. Otherwise, a large di/dt will result.

Treating the OCD load as capacitive is an excellent approximation for previous speeds. As the combination of density and machine cycle, the individual reflections are not merged and the capacitance approximation no longer works.

Also in an OCD, care must be exercised in treating the output load as capacitive. Part of the load is due to transmission lines and the reflections almost always occur since the terminating impedance never matches the transmission line impedance in FET as machine cycle time gets smaller and OCD speed goes up.

Thus, an object of the present invention is to provide a driver circuit for reducing off-chip electrical disturbances in an FET processor.

Another object of the present invention is to provide an off-chip driver circuit for FET processors using feedback signals to control the rise and fall times of the driver output signals.

Still another object of the present invention is to provide an off-chip driver circuit for FET processors incorporating control means for comparing the driver output signal rise and fall times to a reference signal and for providing a feedback signal therefrom to control the rise and fall time of the driver output signal.

A still further object of the present invention is to provide an off-chip driver circuit for FET processors that significantly reduces signal rise and fall di/dt problems.

A further object of the present invention is to provide an off-chip driver circuit wherein output signal rise and fall characteristics are compared to a preselected signal rise and fall standard monitor.

A still further object of the present invention is to provide an off-chip driver circuit for FET processors that dynamically matches the transmission line $Z_o$, thereby reducing reflections on the drive side. The foregoing and other objects, features and advantages of this invention will be apparent from the following more particular description of the invention, as illustrated in the accompanying drawings.

DISCLOSURE OF THE INVENTION

Figure 1:
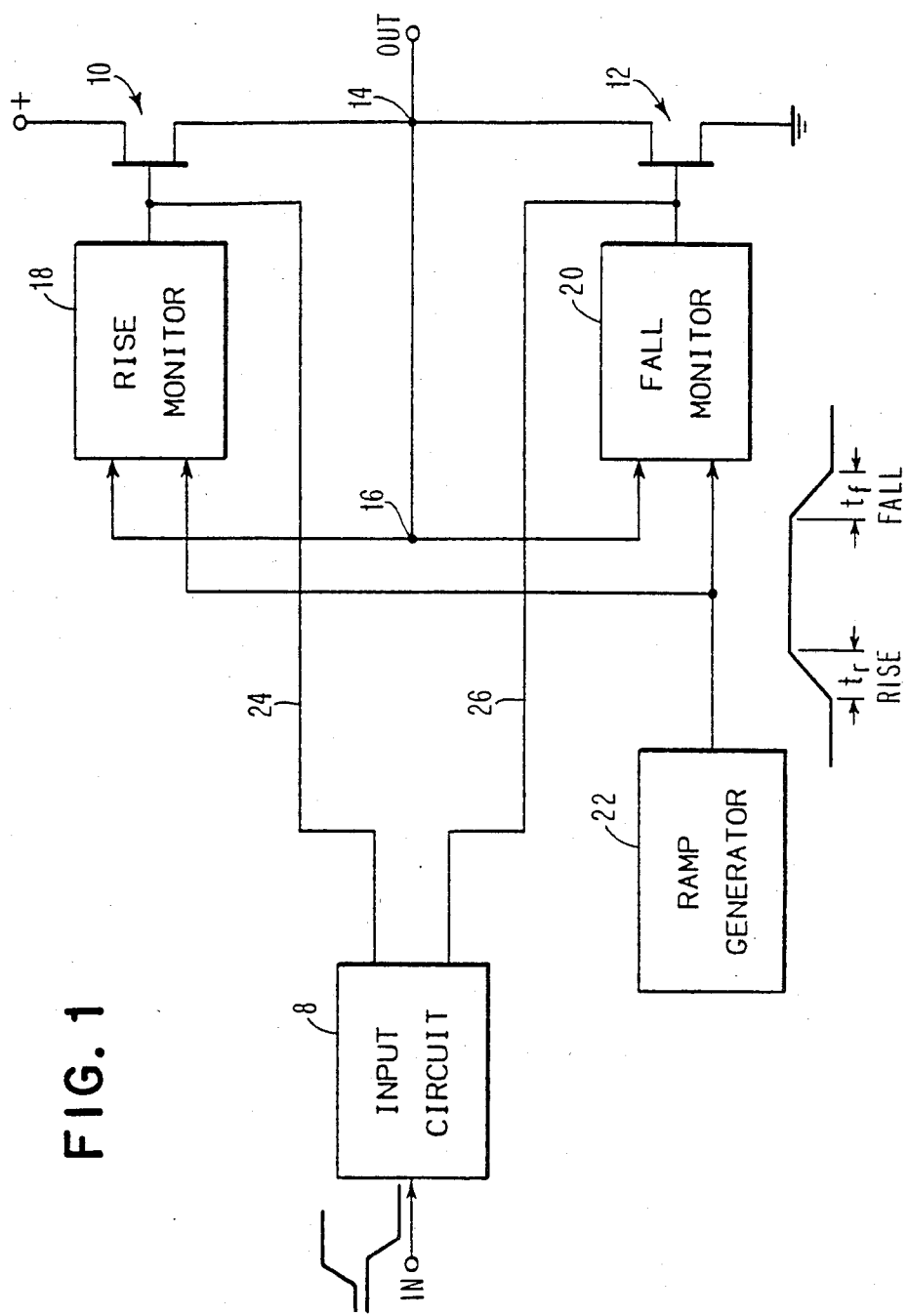
FIG. 1 is a schematic block diagram of an off-chip driver circuit according to the principles of the present invention.

A schematic block diagram of the off-chip driver (OCD) circuit of the present invention is shown in FIG. 1.

The circuit includes a first output device 10 and a second output device 12 having a common output connection 14. A rising (1 bit) or falling (0 bit) signal is applied to an input circuit 8 to provide enabling signals to output devices 10 and 12.

The output signal which appears at output connection 14, as well as at node 16, exhibits a rise slope di/dt, a rise time $t_r$, a fall slope di/dt and a fall time $t_f$ associated with the rise and fall of the input signal. A first monitoring device 18 is connected to the output signal at node 16 to monitor the rise time $t_r$ of the output signal and a second monitoring device 20 is connected to node 16 to monitor the fall time $t_f$ of the output signal.

A ramp generator 22 is provided which generates a reference signal as shown in FIG. 1 which also includes a rise time $t_r$ and a fall time $t_f$.

The two monitor circuits 18 and 20, which operate separately and independently of each other, respectively, compare the rise and fall times of the output signal from node 16 with the reference rise time (in circuit 18) and reference fall time (in circuit 20). If the comparison shows that the rise time of the output signal is faster or slower than the reference signal rise time, a corresponding feedback signal is provided from monitor circuit 18 on lead 24 which controls the output signal. If the output signal has a rise time faster than the $t_r$ of the reference signal from generator 22, then the feedback signal on lead 24 reduces the rise time of the output signal. If the rise time signal becomes too slow, then the feedback signal on lead 24 increases the rise time of the output signal. The same operation occurs with a feedback signal on lead 26 from monitor circuit 20 for the fall time. Thus, larger rise and fall times lead to smaller di/dt and the output waveform is independent of the load devices. Furthermore, any reflections or distortions occurring on the output line which tend to change the rise or fall times of the driver will be compensated for because the comparison with the reference signal is made with the signal on the output line.

Figures 2, 2A:
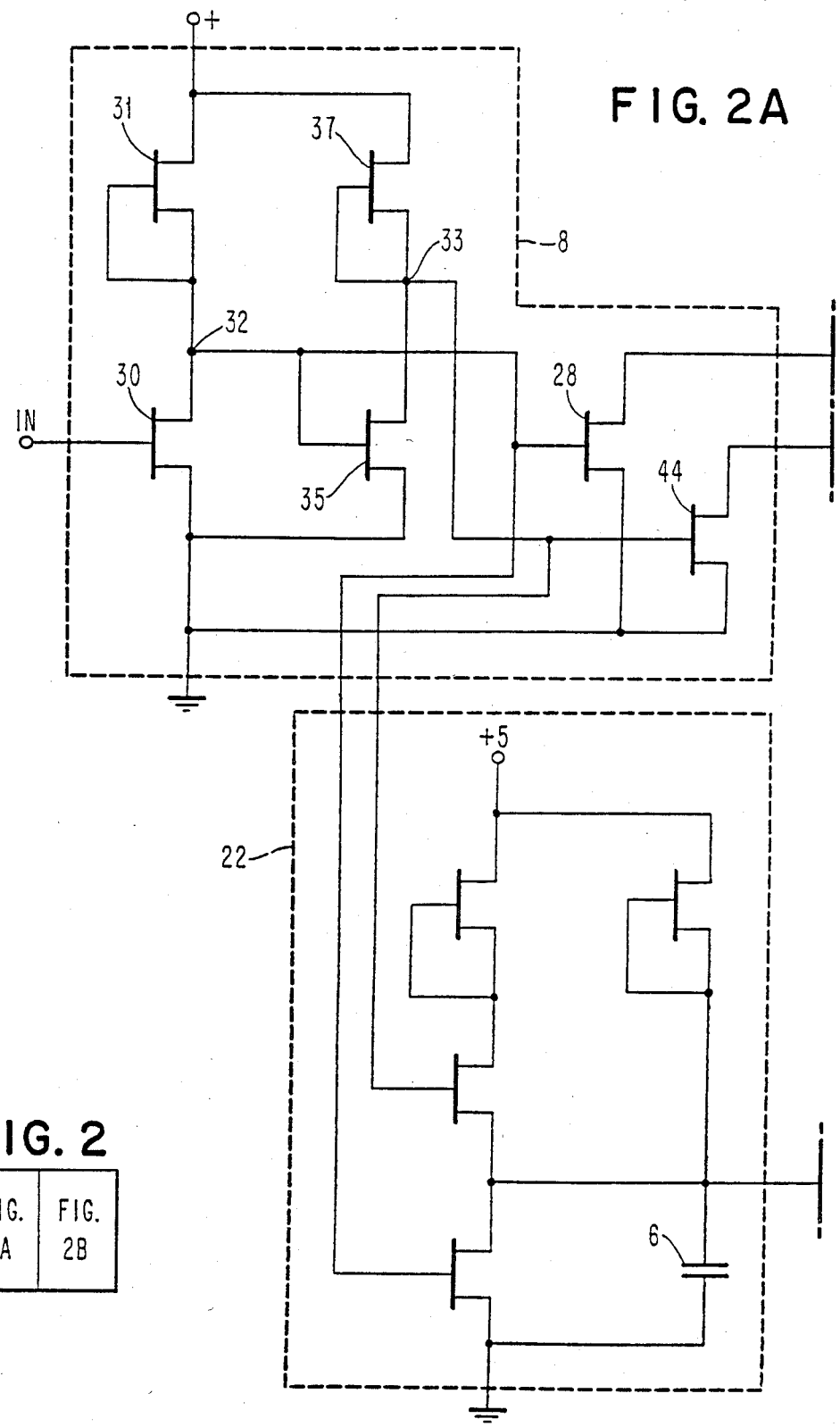
FIGS. 2A and 2B are a more detailed schematic circuit of the off-chip driver circuit of FIG. 1.
Figure 2B:
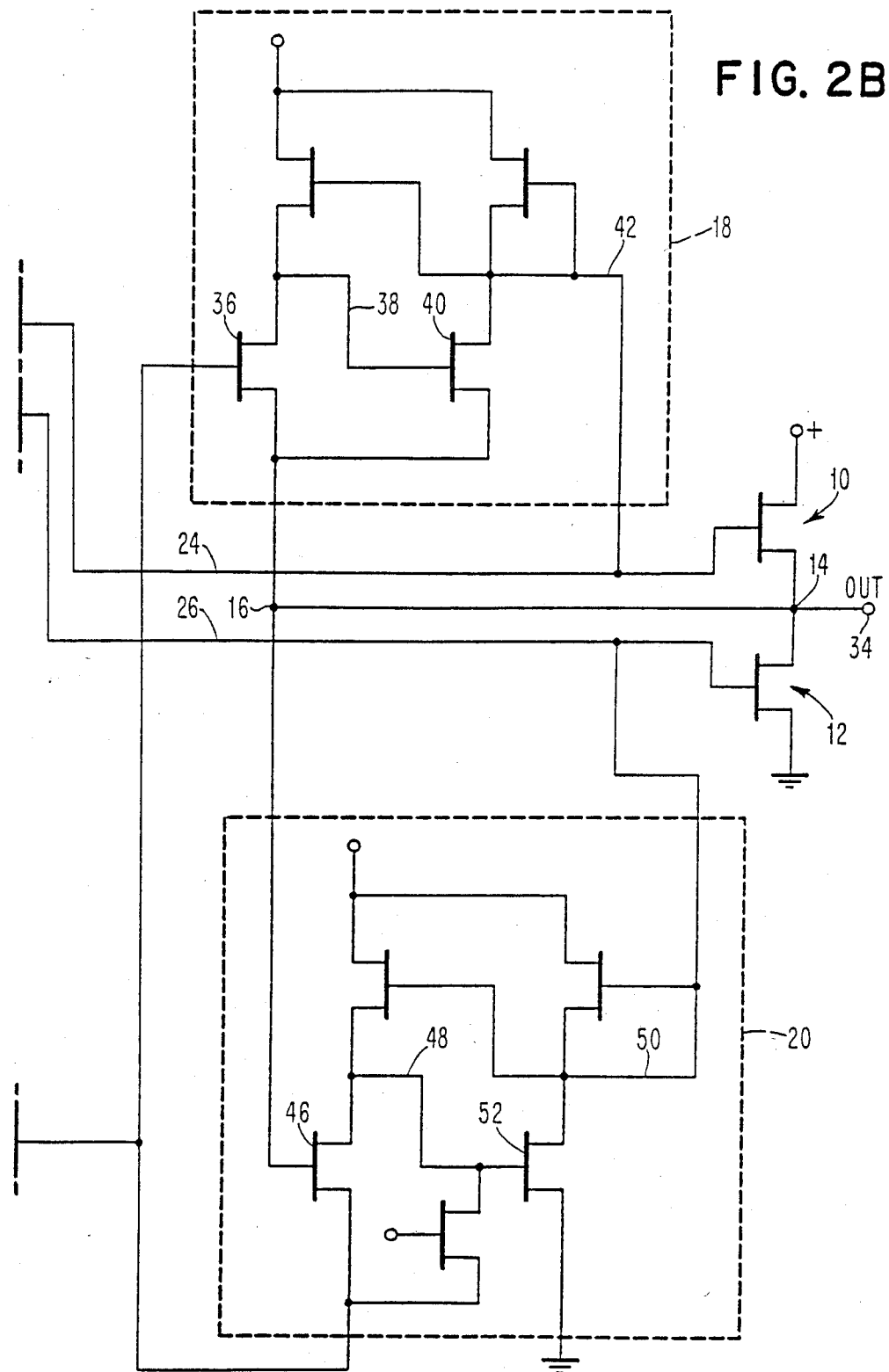

The circuit of FIG. 1 is more clearly shown in FIG. 2 wherein the same functional elements have been designated by the same reference numbers. As previously stated, an input signal is applied to input circuit 8 which signal may have a rising or a falling slope. The case of a rising signal will be discussed first.

Initially, device 28 is on (closed) so that the signal on lead 24 is clamped to ground and device 10 is kept inactive or off. The rising input signal is applied to device 30 which operates to pull down the signal on node 32 which is also connected to depletion device 31, such that the input signal is inverted and the input to device 28 falls low. The input signal to device 44, obtained from node 33 connected between device 35 and depletion device 37, follows the input signal and rises. This turns off (i.e., opens) device 28, releasing or unclamping lead 24. The output signal from output terminal 34 is initially at zero voltage level as is the reference ramp signal from the output of ramp generator 22 which is connected to the device 36 in rise monitor 18. The zero voltage level at device 36 causes the signal on lead 38 on the gate of device 40 to be high and the signal on lead 42 to be low.

Ramp generator 22 is a conventional signal generator responsive to the inverted form of the input signal from node 32. Ramp generator 22 is also responsive to the re-inverted signal which was applied to device 44 such that by operation of the devices charging and discharging capacitor 6, a ramp signal is generated having selected rising and falling portions with predetermined rise and fall times as shown in FIG. 1.

As the ramp signal from generator 22 (applied to the gate of device 36 in monitor 18) rises, the signal on lead 38 goes low and the signal on lead 42 rises. Device 44 is on, and the lead 26 is clamped to ground. Lead 42 is connected to device 10 so device 10 turns on, raising the signal on output lead node 14, thereby producing a rising output signal at output terminal 34.

If the output signal (present at node 14 which is connected to device 36 in rise monitor 18) rises faster than the reference ramp signal which is applied to the gate of device 36, the signal on lead 38 goes higher, the signal on lead 42 goes lower, which in turn causes device 10 to conduct less (slow up) and the rise time of the output signal at node 14 slows up, thereby tracking the rise time of the reference ramp signal from generator 22.

The ramp output signal from generator 22 will rise higher (i.e., +5 volts) than the maximum rise of the output signal on node 14 and output terminal 34 (i.e., +3 volts), and when the ramp signal exceeds the output signal (i.e., > +3) then lead 38 of the rise monitor 18 is low and lead 42 gradually rises, leaving device 10 on.

In the case of a falling input signal to device 30 of input circuit 8, the signal on node 32 goes up (inverts to input signal) and signal applied to device 44 goes down. Device 44 goes off (i.e., opens) which releases or unclamps lead 26, permitting device 12 to operate. The output signal on output terminal 34 and node 16 is initially at a raised level (i.e., +3 previously mentioned) and the ramp signal from generator 22 is higher (i.e., +5 previously mentioned). The output signal from node 16 and the ramp signal from generator 22 are applied to device 46 of fall monitor 22, therefore, lead 48 is high and lead 50 is low.

As the ramp signal from generator 22 falls, lead 48 goes low and lead 50 goes up. When the value of the ramp signal goes below the output signal, device 46 opens and lead 48 goes low, device 52 opens and lead 50 goes up. Since lead 50 is connected to device 12, device 12 turns on (closes) and pulls the voltage level of node 14 down (falls).

The output signal on node 14 (and output terminal 34) is also connected to the input to device 46 of fall monitor 22, and if it falls faster than the reference ramp signal applied to device 46 from generator 22, then the signal on lead 48 goes high, the signal on lead 50 goes low, the conduction of devices 12 slows, and the fall time of the output signal is made slower.

If the output signal falls slower than the ramp generator signal, a converse feedback operation occurs, wherein lead 50 goes up, device 12 conducts faster and the output signal falls faster.

Thus, the circuit of FIG. 2 not only controls the waveshape of the rise and fall ramps of the circuit output signal (the di/dt), but since the feedback control is obtained from the output lead, any reflections back from the output devices (the transmission lines) which tend to change the output signal rise and fall are also compensated.

The embodiment of concepts of the present invention was shown and described as an NMOS FET structure. Other embodiments of the invention may be provided on other available structures, such as CMOS using routine design techniques.

Having thus described my invention, what I claim as new, and desire to secure by Letters Patent is:

1. A driver circuit for providing an output signal having a rise time adjusted in accordance with a rise time of a standard ramp signal comprising:
    an input circuit responsive to an input signal of the type having a rising level, said input circuit providing a corresponding rising signal on an output lead therefrom,
    an output circuit including at least one output device having an output connection, said at least one output device being connected to said output lead of said input circuit and responsive to said corresponding rising signal of said input circuit,
    a ramp generator circuit connected to said output lead of said input circuit for providing an output signal having a desired rise time in response to said corresponding rising signal on said input circuit output lead,
    a monitor circuit connected to said output connection of said at least one output device and to said ramp generator and responsive to said signals thereon to provide a feedback signal to said at least one output device when said output signal rises faster or slower than said ramp signal, said feedback signal adjusting said output signal in accordance with the rise time of said ramp signal.

2. A driver circuit according to claim 1 for providing an output signal having rise times and fall times adjusted in accordance with rise and fall times of a standard ramp signal wherein
    said input circuit is responsive to an input signal of the type having rising and falling signal levels, said input circuit providing a corresponding rising signal on a first output lead and a corresponding falling signal on a second output lead,
    said output circuit includes first and second output devices having a common output connection, said first output device being connected to said first output lead of said input circuit and responsive to said rising signal of said input circuit and said second output device being connected to said second output lead of said input circuit and responsive to said falling signal of said input circuit,
    said ramp generator circuit is connected to said first and second output leads of said input circuit for providing an output signal having desired rise and fall times in response to said rising and falling signals on said input circuit output leads,
    said monitor circuit is a first monitor circuit and is connected to said common output connection of said first and second output devices and to said ramp generator and is responsive to said signals thereon to provide a feedback signal to said first output device when said output signal rises faster or slower than said ramp signal, said feedback signal adjusting said output signal in accordance with the rise time of said ramp signal,
    and wherein said driver circuit further includes a second monitor circuit connected to said ramp generator and said common output connection of said first and second output devices and is responsive to the signals therefrom to provide a feedback signal to said second output device when said output signal falls faster or slower than said ramp signal, said feedback signal adjusting said output signal in accordance with the fall time of said ramp signal.

3. A driver circuit according to claim 2 wherein said first monitor circuit includes a first transistor device connected to the output of said ramp generator circuit for providing an opposite, falling signal in response to said rising signal from said ramp generator circuit, a second transistor device connected to said first transistor device for producing a rising signal in response to said falling signal from said first transistor, said rising signal from said second transistor being electrically connected to said first output device to produce a rising signal on said common output connection,
    and wherein said common output connection is electrically connected to said first transistor device to feedback said signal from said common output connection for controlling the output signal from said first transistor device, such that the said output from said first transistor device and consequently the output from said second transistor device is determined by said ramp generator output signal and said signal on said common output connection.

4. A driver circuit according to claim 3 wherein said second monitor circuit includes a third transistor device connected to the output of said ramp generator circuit for providing an opposite, rising signal in response to said falling signal from said ramp generator circuit, a fourth transistor device connected to said third transistor device for producing a falling signal in response to said rising signal from said third transistor, said falling signal from said fourth transistor being electrically connected to said second output device to produce a falling signal on said common output connection, and wherein said common output connection is electrically connected to said third transistor device to feedback said signal from said common output connection for controlling the output signal from said third transistor device, such that the said output from said third transistor device and consequently the output from said fourth transistor device is determined by said ramp generator output signal and said signal on said common output connection.

* * * * *